United States Patent
Hsiao et al.

(10) Patent No.: US 8,120,392 B2
(45) Date of Patent: Feb. 21, 2012

(54) FREQUENCY DIVIDING CIRCUIT

(75) Inventors: Chiao-Wei Hsiao, Taichung (TW);
Chung-Wei Lin, Hsinchu (TW)

(73) Assignee: Novatek Microelectronics Corp.,
Hsinchu (TW)

( * ) Notice: Subject to any disclaimer, the term of this patent is extended or adjusted under 35 U.S.C. 154(b) by 45 days.

(21) Appl. No.: 12/614,508

(22) Filed: Nov. 9, 2009

(65) Prior Publication Data
US 2010/0207671 A1    Aug. 19, 2010

(30) Foreign Application Priority Data
Feb. 18, 2009  (TW) ............................... 98105182 A

(51) Int. Cl.
*H03K 21/00*    (2006.01)
*H03K 23/00*    (2006.01)
(52) U.S. Cl. ........................ 327/115; 327/117; 377/47
(58) Field of Classification Search .......... 327/113–115, 327/117, 118; 377/47, 48
See application file for complete search history.

(56) References Cited

U.S. PATENT DOCUMENTS

| 5,506,532 | A | * | 4/1996 | Milazzo | 327/175 |
| 2003/0020554 | A1 | * | 1/2003 | Lin | 331/115 |
| 2010/0295584 | A1 | * | 11/2010 | Sano | 327/145 |
| 2010/0301906 | A1 | * | 12/2010 | De Laurentiis et al. | 327/115 |

FOREIGN PATENT DOCUMENTS

| CN | 1610257 | A |   | 4/2005 |
| JP | 01049416 | A | * | 2/1989 |
| JP | 02073714 | A | * | 3/1990 |
| JP | 2004056717 | A | * | 2/2004 |
| JP | 2005348168 | A | * | 12/2005 |

* cited by examiner

*Primary Examiner* — Patrick O'Neill
(74) *Attorney, Agent, or Firm* — Rabin & Berdo, P.C.

(57) ABSTRACT

A frequency dividing circuit performs a frequency dividing operation on N input clock signals to obtain N output clock signals, wherein N is a natural number greater than 1. The frequency dividing circuit includes a frequency divider and a flip-flop. The frequency divider samples an initial signal according to a first input clock signal of the N input clock signals to accordingly generate a first output clock signal of the N output clock signals. The initial signal corresponds with an inverse signal of the first output clock signal. The flip-flop samples the first output clock signal to accordingly generate a second output clock signal of the N output clock signals according to a second input clock signal of the N input clock signals.

17 Claims, 5 Drawing Sheets

FREQUENCY DIVIDING CIRCUIT

This application claims the benefit of Taiwan application Serial No. 98105182, filed Feb. 18, 2009, the subject matter of which is incorporated herein by reference.

BACKGROUND OF THE INVENTION

1. Field of the Invention

The invention relates in general to a frequency dividing circuit, and more particularly to a frequency dividing circuit for frequency-dividing one set of clock signals with a uniform phase delay into another set of clock signals with a uniform phase delay.

2. Description of the Related Art

In the present circuit applications, some applications sometimes need multiple input clock signals and frequency-divided clock signals thereof to perform the circuit control. In the prior art, multiple flip-flops sample multiple reference signals in response to the rising edge or the falling edge of the input clock signal to generate the frequency-divided clock signals corresponding with the input clock signals, wherein the phase delay between any two neighboring clock signals of the clock signals is equal to a constant, for example. The phase delay between any two neighboring clock signals of the frequency-divided clock signals is also equal to a constant, for example.

However, the prior art cannot perform the effective control on the initial level of each reference signal. Consequently, the frequency-divided clock signal, obtained after the flip-flop samples the input clock signal, may have phase errors. Thus, it is an important subject in the industry to design a frequency dividing circuit capable of effectively preventing the clock signal, obtained after frequency dividing, from having a phase error.

SUMMARY OF THE INVENTION

The invention is directed to a frequency dividing circuit for controlling a level of an input signal of each stage of flip-flops by a structure including multiple stages of flip-flops connected in series. Thus, compared with the conventional frequency dividing circuit, the frequency dividing circuit of the invention can prevent frequency-divided clock signals, generated by frequency dividing, from having error phases and can advantageously generate the frequency-divided clock signals with the precise phase.

According to the present invention, a frequency dividing circuit is provided. The frequency dividing circuit performs a frequency dividing operation on N input clock signals to obtain N output clock signals, wherein N is a natural number greater than 1. The frequency dividing circuit includes a frequency divider and a first flip-flop. The frequency divider samples an initial signal to generate a first output clock signal of the N output clock signals according to a first input clock signal of the N input clock signals, wherein the initial signal corresponds with an inverse signal of the first output clock signal. The first flip-flop samples the first output clock signal to generate a second output clock signal of the N output clock signals according to a second input clock signal of the N input clock signals.

The invention will become apparent from the following detailed description of the preferred but non-limiting embodiments. The following description is made with reference to the accompanying drawings.

DETAILED DESCRIPTION OF THE INVENTION

The frequency dividing circuit of this embodiment controls a level of an input signal of each stage of flip-flops by the serial connection of multiple stages of flip-flops to prevent the phase of the frequency-divided clock signal generated by frequency dividing from having an error.

The frequency dividing circuit of this embodiment performs a frequency dividing operation on N input clock signals to obtain N output clock signals, wherein N is a natural number greater than 1. The frequency dividing circuit includes a frequency divider and a flip-flop. The frequency divider samples an initial signal to generate a first output clock signal of the N output clock signals according to a first input clock signal of the N input clock signals, wherein the initial signal corresponds with an inverse signal of the first output clock signal. The flip-flop samples the first output clock signal to generate a second output clock signal of the N output clock signals according to a second input clock signal of the N input clock signals.

Figure 1:
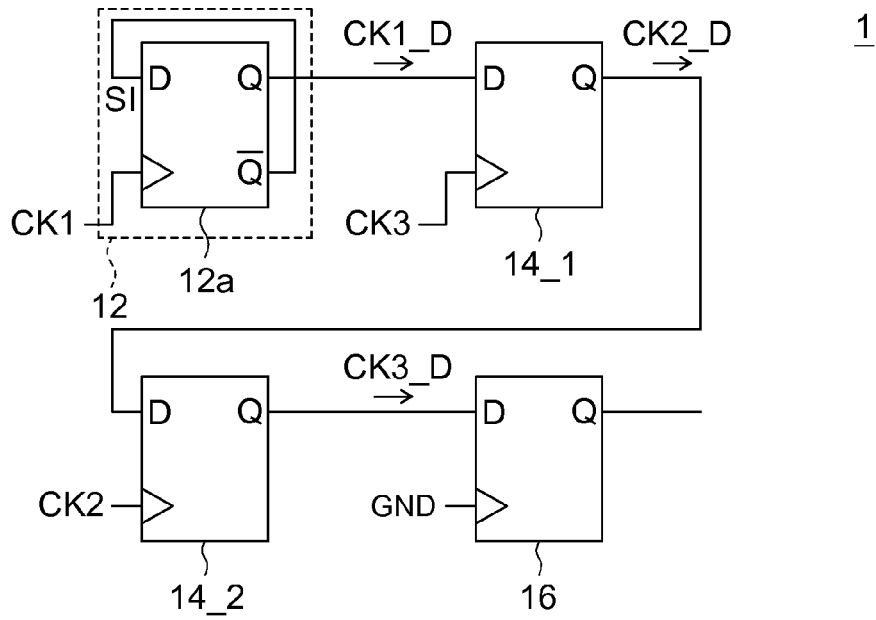
FIG. 1 is a block diagram showing a frequency dividing circuit according to an embodiment of the invention.
Figure 2:
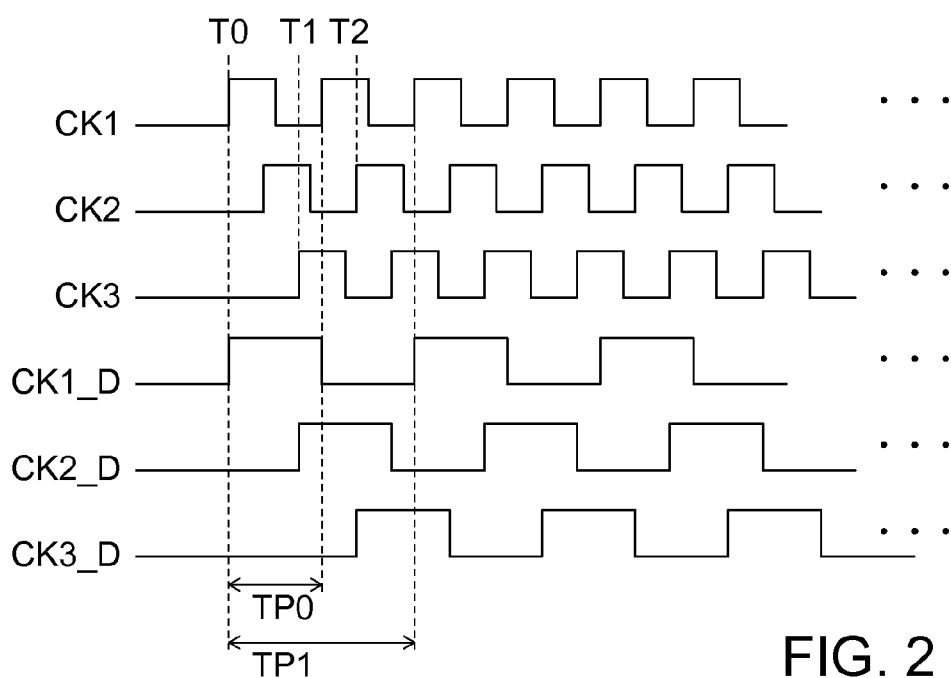
FIG. 2 is a timing chart showing signals associated with the frequency dividing circuit of FIG. 1.

FIG. 1 is a block diagram showing a frequency dividing circuit 1 according to an embodiment of the invention. FIG. 2 is a timing chart showing signals associated with the frequency dividing circuit 1 of FIG. 1. The frequency dividing circuit 1 performs a frequency dividing operation on N input clock signals CK1 to CKN to obtain N output clock signals CK1_D to CKN_D, wherein N is a natural number greater than 1. For example, N is equal to 3. Any two neighboring signals of the input clock signals CK1 to CK3 have the same phase delay $2\pi/3$. The period of the input clock signals CK1 to CK3 is TP0.

The frequency dividing circuit 1 includes a frequency divider 12 and flip-flops 14_1 and 14_2. The frequency divider 12 includes a flip-flop 12a for sampling an initial signal SI to generate the output clock signal CK1_D according to the input clock signal CK1. The initial signal SI corresponds with an inverse signal of the output clock signal CK1_D.

The flip-flop 14_1 samples the output clock signal CK1_D according to the input clock signal CK_3 to generate the output clock signal CK2_D. The flip-flop 14_2 samples the output clock signal CK2_D according to the input clock signal CK_2 to generate the output clock signal CK3_D. The period of the output clock signals CK1_D to CK3_d is TP1, which is equal to two times of the period TP0, for example.

In this example, the output clock signal CK1_D generated by the frequency dividing of the frequency divider 12 serves as an input signal provided to the flip-flop 14_1. Thus, at the time point T1 when the rising edge of the input clock signal CK3 is triggered, the input signal of the flip-flop 14_1 (i.e., the output clock signal CK1_D) is controlled to have the high signal level. As a result, the output clock signal CK2_D generated by the flip-flop 14_1, which samples the input clock signal CK3, has the correct signal level and signal phase.

Similarly, the output clock signal CK2_D generated by the flip-flop 14_1 serves as the input signal provided to the flip-flop 14_2. Consequently, at the time point T2 when the rising edge of the input clock signal CK2 is triggered, the input signal of the flip-flop 14_2 (i.e., the output clock signal CK2_D) is controlled to have the high signal level. As a result, the output clock signal CK3_D generated by the flip-flop 14_2, which samples the input clock signal CK2, has the correct signal level and signal phase.

For example, each of the flip-flops 12a, 14_1 and 14_2 has an operation delay time. Because the output clock signal CK1_D is generated by the flip-flop 12a, which samples the input clock signal CK1, the rising edge of the output clock signal CK1_D is delayed by the operation delay time with respect to the rising edge of the input clock signal CK1. Similarly, the rising edges of the output clock signals CK2_D and CK3_D are respectively delayed by the operation delay time with respect to the rising edge of the input clock signal CK3 and the rising edge of the input clock signal CK2. In other words, compared with the rising edges of the input clock signals CK1, CK3 and CK2, the rising edges of the output clock signals CK1_D, CK2_D and CK_D are respectively delayed by the same delay time. Accordingly, the same phase delay may be kept between any two signals of the output clock signals CK1_D, CK2_D and CK3_D generated after the frequency dividing operation of the frequency dividing circuit 1.

For example, the output clock signal CK3_D of the output clock signals CK1_D to CK3_D (having the period TP1) after the frequency dividing has the phase delay $2\pi/3$ with respect to the output clock signal CK2_D, and the output clock signal CK2_D has the phase delay $2\pi/3$ with respect to the output clock signal CK1_D.

The frequency dividing circuit 1 of this embodiment further includes, for example, a load matching circuit 16 serving as a balance load cascaded behind the flip-flop 14_2 such that substantially the same output loads are presented for the output clock signals CK3_D, CK2_D, and CK1_D. For example, the load matching circuit 16 is a flip-flop circuit controlled by the signal GND.

Figure 3:
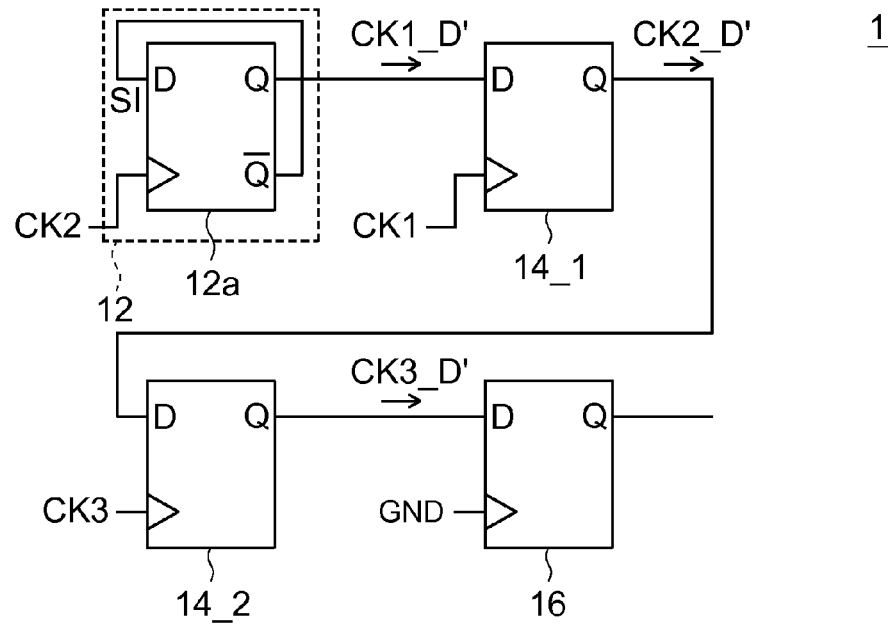
FIG. 3 is another block diagram showing the frequency dividing circuit according to the embodiment of the invention.
Figure 4:
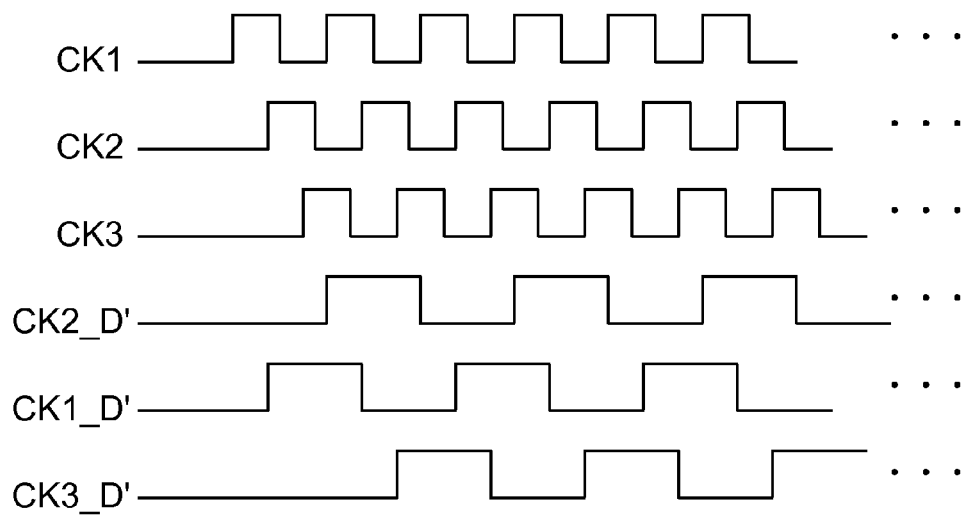
FIG. 4 is a timing chart showing signals associated with the frequency dividing circuit of FIG. 3.

In this illustrated embodiment, the frequency dividing circuit 1 performs the frequency dividing operation according to the input clock signals CK1 to CK3 to generate the output clock signal CK1_D, which corresponds to an initial phase (that is the zero phase) at the time point T0 and the corresponding output clock signals CK2_D and CK3_D. However, the frequency dividing circuit 1 of this embodiment is not limited thereto. In other examples, the signal allocation of the frequency dividing circuit may also be adjusted to generate the output clock signal CK1'_D, which corresponds to the initial zero phase at the time point T1 and the corresponding output clock signals CK2'_D and CK3'_D, as shown in FIGS. 3 and 4.

Figure 5:
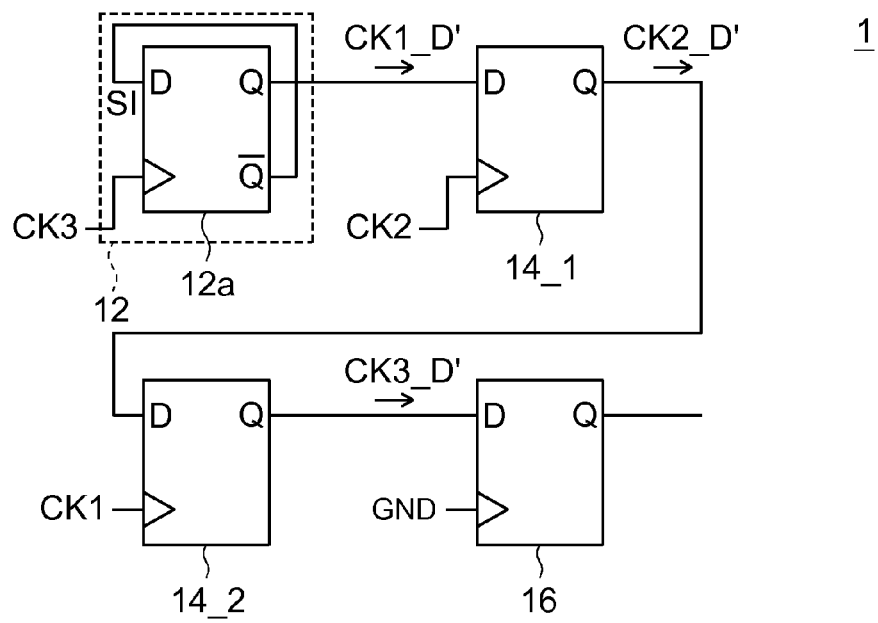
FIG. 5 is still another block diagram showing the frequency dividing circuit according to the embodiment of the invention.
Figure 6:
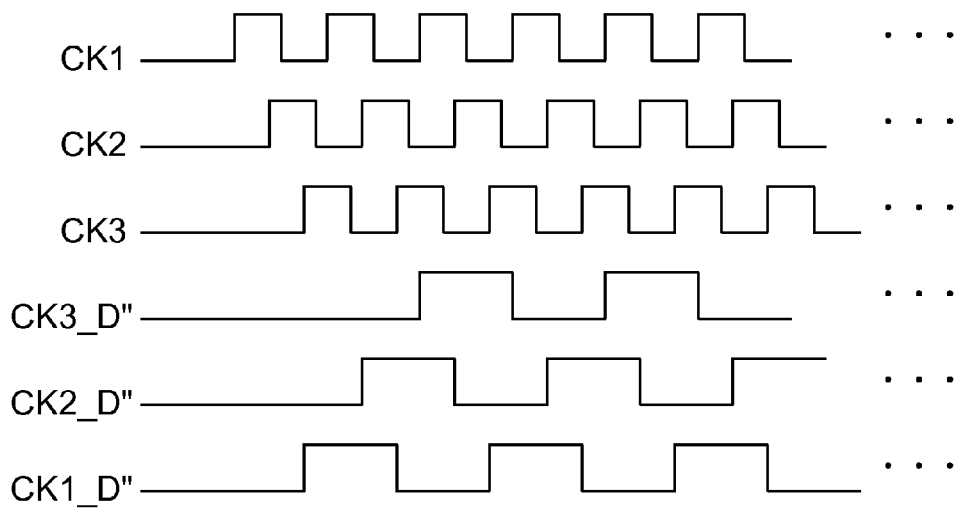
FIG. 6 is a timing chart showing signals associated with the frequency dividing circuit of FIG. 5.

Similarly, it is also possible to adjust the signal allocation of the frequency dividing circuit to generate the initial zero phase corresponding with the output clock signal CK1''_D at the time point T2 and the corresponding clock signals CK2''_D and CK3''_D, as shown in FIGS. 5 and 6.

In this illustrated embodiment, the frequency dividing circuit 1 includes the flip-flops 12a, 14_1 and 14_2 to perform the frequency dividing operation according to the input clock signals CK1 to CK3 to generate the clock signals CK1_D-CK3_D. However, the frequency dividing circuit 1 of this embodiment is not limited thereto. In another example, a frequency dividing circuit 1' includes 16 flip-flops 12a' and 14_1' to 14_15' for performing sampling operations according to even numbered input clock signals of input clock signals CK0', CK1', CK2', ..., CK15' to generate output clock signals CK0_D',CK1_D',CK2_D', ..., CK15_D', as shown in FIG. 7.

Figure 7:
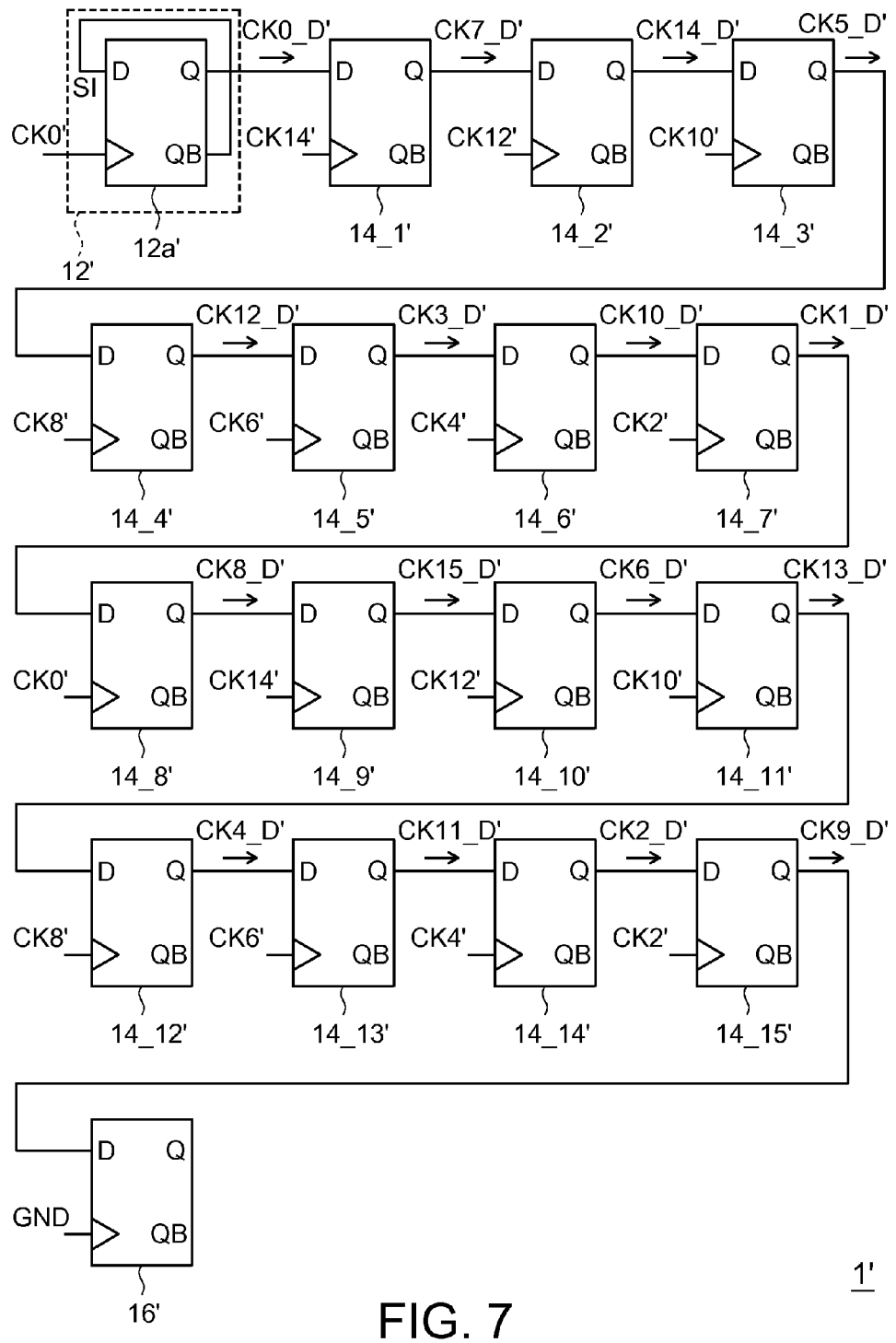
FIG. 7 is yet still another block diagram showing the frequency dividing circuit according to the embodiment of the invention.
Figure 8:
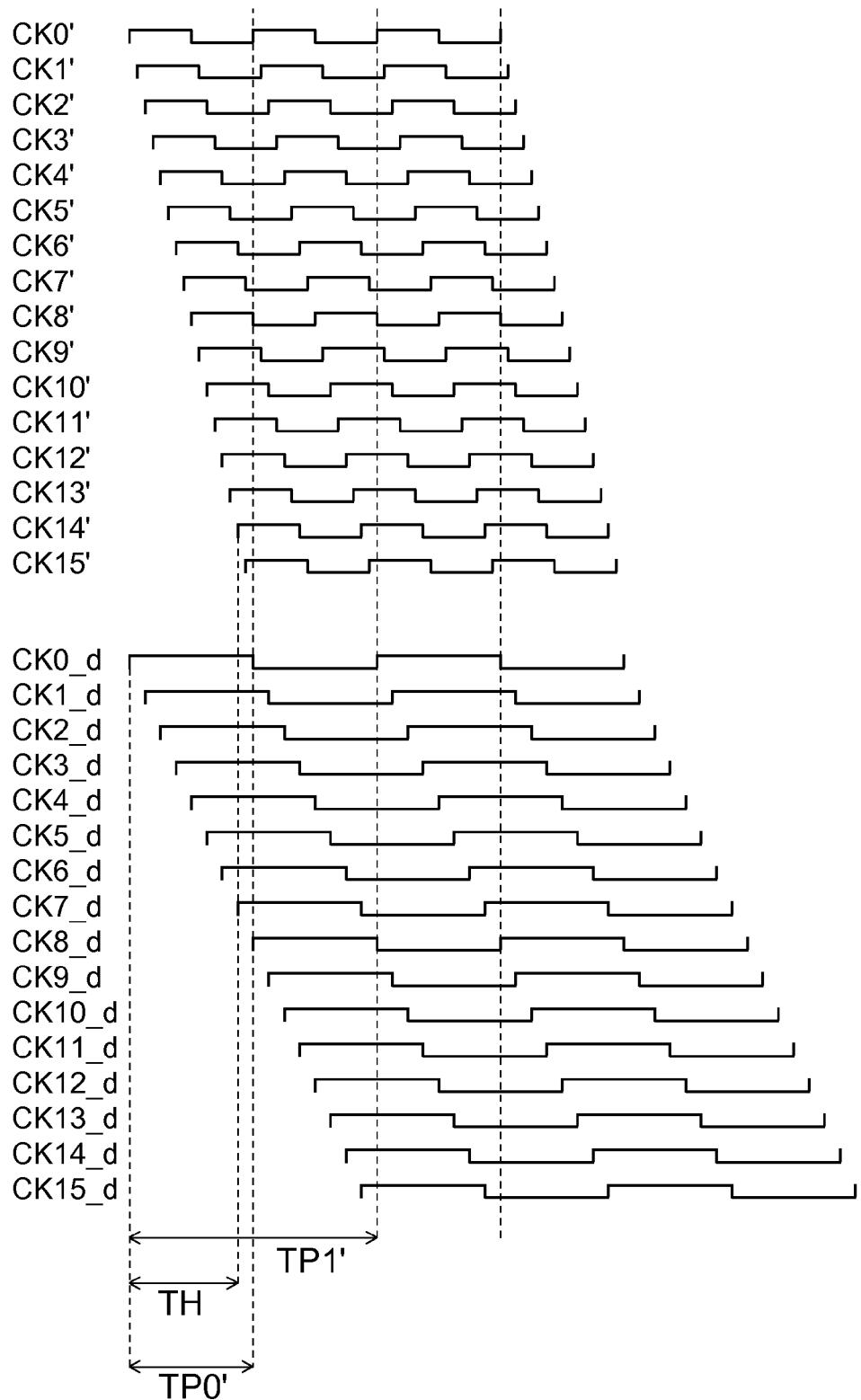
FIG. 8 is a timing chart showing signals associated with the frequency dividing circuit of FIG. 7.

For example, FIG. 8 is a timing chart showing signals associated with the frequency dividing circuit 1' of FIG. 7. The period of the input clock signals CK0' to CK15' is TP0', and the phase delay between any two neighboring signals is $\pi/8$. The period of the output clock signals CK0_d to CK15_d obtained after the frequency dividing operation is TP1', which is equal to two times of the period TP0', for example. The phase delay between any two neighboring signals of the output clock signals CK0_d to CK15_d is equal to $\pi/8$. The zero phases of the input clock signal CK0' and the output clock signal CK0_d correspond with the same time point, for example.

In this illustrated example, the frequency dividing circuit 1' performs the sampling operations according to the even numbered input clock signals of the input clock signals CK0' to CK15' to generate the output clock signals CK0_d to CK15_d. However, the frequency dividing circuit of this embodiment is not limited thereto. In other examples, the frequency dividing circuit 1' may also perform the sampling operations using the odd number input clock signals of the input clock signals CK0' to CK15' to generate the corresponding output clock signals. However, compared with the corresponding output clock signals CK0_d to CK15_d of FIG. 8, the output clock signals generated by sampling according to the odd number input clock signals of the input clock signals CK0' to CK15' are further delayed by the phase delay $\pi/16$.

In the example of FIG. 7, the flip-flop 14_1' is utilized to perform sampling on the output clock signal CK0_d according to the input clock signal CK14'. As shown in FIG. 8, it is obtained that, in this condition, the input signal of the flip-flop 14_1' (i.e., the output clock signal CK0_D') is kept at the high signal level for the time T, which satisfies:

$$T = TP1' \times \frac{7}{16}.$$

Consequently, it is possible to prevent the operation of the flip-flop 14_1' from causing an error in the sampled result of the flip-flop 14_1' due to the too short level keeping time of the input signal.

According to the same design concept, the flip-flops 14_2' to 14_7' are adopted to perform sampling on the output clock signals CK7_D',CK14_D',CK5_D',CK12_D',CK3_D' and CK10_D according to the clock signals CK12'-CK2', and the flip-flops 14_8' to 14_15' are adopted to respectively perform sampling on the output clock signals CK5_1',CK8_D', CK15_D',CK6_D',CK13_D',CK4_D',CK11_D' and CK2_D' according to the clock signals CK0' to CK2' to prevent the flip-flops 14_2' to 14_15' from causing errors in the sampled results of the flip-flops 14_2' to 14_15' due to the too short level keeping time of the input signal.

In other example, as long as the level keeping time of the input signal of each of the flip-flops 12a' and 14_1' to 14_15' satisfies the setup time of the flip-flops 12a' and 14_1' to 14_15', it is also possible to adjust the coupling relationships between the flip-flops 12a1' and 14_1' to 14_15' without the limitation of the coupling relationships shown in FIG. 7.

The frequency dividing circuit of this embodiment controls the level of the input signal of each stage of flip-flops via multiple stages of flip-flops connected in series to prevent the phase of the frequency-divided clock signal generated by the frequency dividing from having an error. Thus, compared with the conventional frequency dividing circuit, the frequency dividing circuit of the invention can advantageously prevent the frequency-divided clock signal, generated by the frequency dividing, from having an error phase and can advantageously generate the frequency-divided clock signal with the precise phase.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency dividing circuit for performing a frequency dividing operation on N input clock signals to obtain N output clock signals, N being a natural number greater than 1, the frequency dividing circuit comprising:
    a frequency divider for sampling an initial signal to generate a first output clock signal of the N output clock signals according to a first input clock signal of the N input clock signals, wherein the initial signal corresponds with an inverse signal of the first output clock signal;
    a first flip-flop for sampling the first output clock signal to generate a second output clock signal of the N output clock signals according to a second input clock signal of the N input clock signals; and
    a second flip-flop for sampling the second output clock signal to generate a third output clock signal of the N output clock signals according to a third input clock signal of the N input clock signals.

2. The frequency dividing circuit according to claim 1, further comprising:
    a load matching circuit, serving as a balance load cascaded behind the second flip-flop, for making the first to third output clock signals have similar output loads.

3. The frequency dividing circuit according to claim 1, wherein a phase sequence of the first to the third input clock signals are first, third and second, the N input clock signals being sequentially aligned according to phases thereof.

4. The frequency dividing circuit according to claim 1, wherein a phase sequence of the first to the third input clock signals are second, first, and third, the N input clock signals being sequentially aligned according to phases thereof.

5. The frequency dividing circuit according to claim 1, wherein a phase sequence of the first to the third input clock signals are third, second and first, the N input clock signals being sequentially aligned according to phases thereof.

6. The frequency dividing circuit according to claim 1, wherein the N input clock signals have substantially the same frequency.

7. The frequency dividing circuit according to claim 6, wherein a phase delay is substantially the same between any two input clock signals that are phase-neighboring of the N input clock signals.

8. The frequency dividing circuit according to claim 6, wherein the N output clock signals have substantially the same frequency.

9. The frequency dividing circuit according to claim 8, wherein a phase delay is substantially the same between any two output clock signals that are phase-neighboring of the N output clock signals.

10. The frequency dividing circuit according to claim 9, wherein a phase delay between any two input clock signals that are phase-neighboring of the N input clock signals is substantially the same as a phase delay between any two output clock signals that are phase-neighboring of the N output clock signals.

11. A frequency dividing circuit for performing a frequency dividing operation on N input clock signals to obtain N output clock signals, N being a natural number greater than 1, the frequency dividing circuit comprising:
    a frequency divider for sampling an initial signal to generate a first output clock signal of the N output clock signals according to a first input clock signal of the N input clock signals, wherein the initial signal corresponds with an inverse signal of the first output clock signal; and
    a plurality of flip-flops connected in series, each except a first flip-flop for sampling a previous output clock signal from a previous flip-flop of said flip-flops to generate a respective output clock signal according to a respective input clock signal of the N input clock signals, the first flip-flop for sampling the first output clock signal from the frequency divider to generate a respective output clock signal according to a respective input clock signal of the N input clock signals.

12. The frequency dividing circuit according to claim 11, further comprising:
    a load matching circuit, serving as a balance load cascaded behind a last flip-flop of said flip-flops, for making the N output clock signals have similar output loads.

13. The frequency dividing circuit according to claim 11, wherein the N input clock signals have substantially the same frequency.

14. The frequency dividing circuit according to claim 13, wherein a phase delay is substantially the same between any two input clock signals that are phase-neighboring of the N input clock signals.

15. The frequency dividing circuit according to claim 13, wherein the N output clock signals have substantially the same frequency.

16. The frequency dividing circuit according to claim 15, wherein a phase delay is substantially the same between any two output clock signals that are phase-neighboring of the N output clock signals.

17. The frequency dividing circuit according to claim 16, wherein a phase delay between any two input clock signals that are phase-neighboring of the N input clock signals is substantially the same as a phase delay between any two output clock signals that are phase-neighboring of the N output clock signals.

* * * * *